(12) United States Patent
Gentzler

(10) Patent No.: US 6,191,652 B1
(45) Date of Patent: Feb. 20, 2001

(54) AMPLIFIER DISTORTION CORRECTION USING CROSS-MODULATION

(75) Inventor: Charles R. Gentzler, Thousand Oaks, CA (US)

(73) Assignee: Powerwave Technologies, Inc., Irvine, CA (US)

(*) Notice: Under 35 U.S.C. 154(b), the term of this patent shall be extended for 0 days.

(21) Appl. No.: 09/425,424

(22) Filed: Oct. 22, 1999

(51) Int. Cl.[7] .................................................. H03F 3/66
(52) U.S. Cl. ................................................ 330/52; 330/151
(58) Field of Search ............................. 330/52, 149, 151

(56) References Cited

U.S. PATENT DOCUMENTS 5,508,657 * 4/1996 Behan ................................ 330/151
5,977,826 * 11/1999 Behan et al. ...................... 330/151

* cited by examiner

Primary Examiner—Robert Pascal
Assistant Examiner—Henry Choe
(74) Attorney, Agent, or Firm—Fish & Richardson P.C.

(57) ABSTRACT

The invention relates to a method and apparatus for reducing the distortion output of an amplifier used with an RF signal. The method and apparatus typically modify the distortion of the amplifier to reduce it, by detecting cross-modulation components modulated onto a continuous wave, low level, pilot signal injected at the input of the amplifier system. The circuitry detects the cross-modulation components and provides correction signals in response thereto.

4 Claims, 1 Drawing Sheet

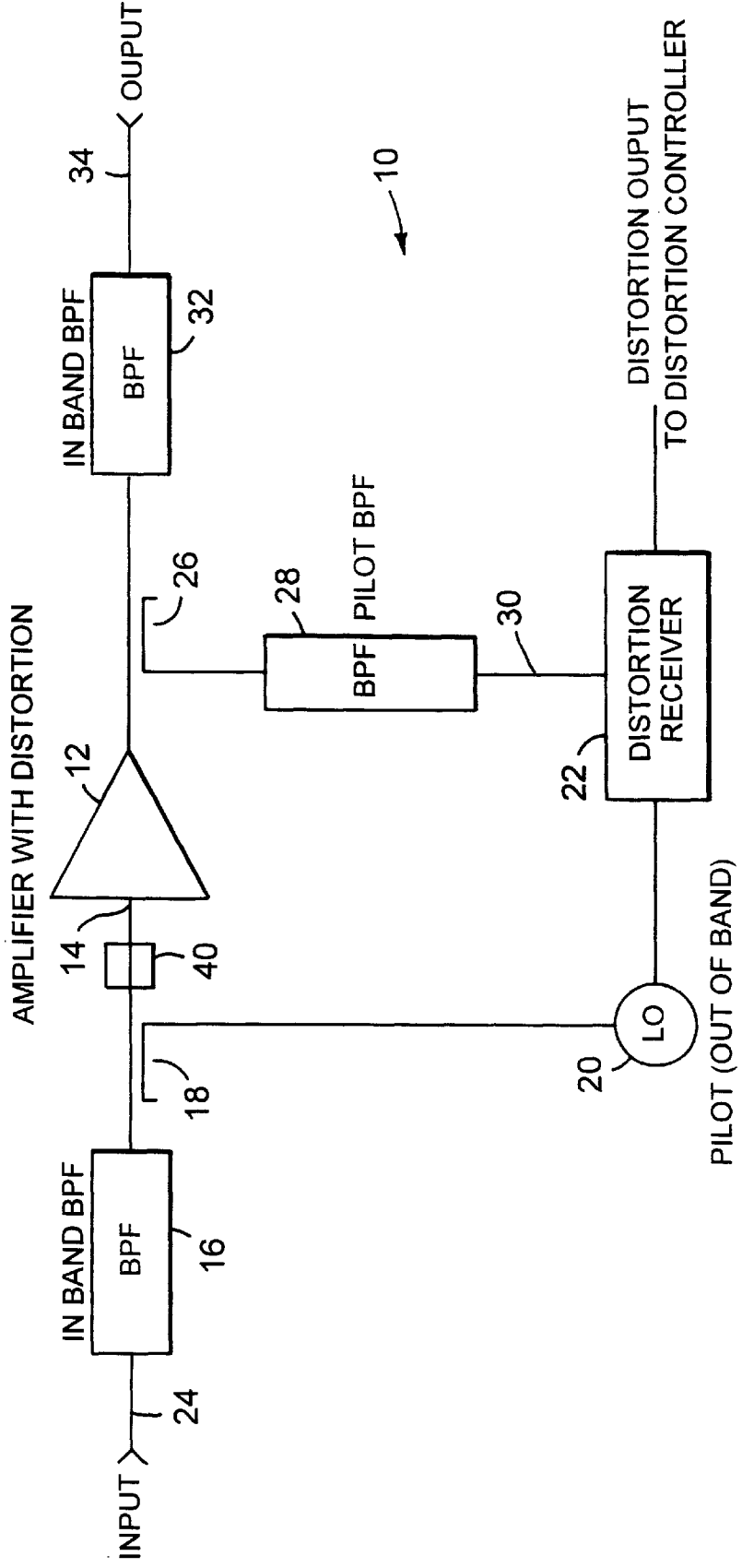

AMPLIFIER DISTORTION CORRECTION USING CROSS-MODULATION

BACKGROUND OF THE INVENTION

The invention relates generally to power amplifiers, and in particular to linearizing the input/output transfer function for an amplifier, a particularly a high power Class AB power amplifier.

High power, broad band power amplifiers are well known. These amplifiers may operate in a feed-forward configuration, or may have other forms of linearization which are required when the main power amplifier operates, for example, as a Class AB amplifier. Although Class A amplifiers usually produce less distortion than Class AB amplifiers, Class A amplifiers are also less efficient than Class AB amplifiers. Thus, in order to retain the advantages of efficiency, while minimizing distortion, Class AB amplifier configurations have been developed which implement various forms of error or distortion correction.

One form of error correction is feed-forward correction which can use an injected pilot signal to correct distortions in the input signal caused by the Class AB amplifier. In another error correction approach, a predistortion circuit using, for example, a gain-phase circuit, can be provided with various adjustments to produce a gain-phase signal from the original signal, so that when the gain-phase signal is input to the power amplifier, operating as a Class AB amplifier, the output is a corrected amplification of the original input signal to the amplifier arrangement.

Even in a properly adjusted amplifier arrangement, using predistortion, a certain amount of instability, that is, drift in the operating point gain and/or phase, can be observed. As a result, a second loop, using an error amplifier, is employed and is tuned using, for example, the pilot signal noted above. While these remaining distortions can be attended to in the feed-forward cancellation loop circuitry, for example, the quadrature pilot signal detection and cancellation circuitry, such as that described in U.S. Pat. No. 5,796,304, the circuit cost is somewhat expensive.

The invention provides an advantageous approach toward maintaining an adequately linear input/output relationship in a distorting amplifier arrangement using a low cost approach employing a pilot signal.

SUMMARY OF THE INVENTION

The invention relates to an amplifier configuration having a main amplifier having an input and an output, a pilot signal generator which generates a low level, out-of-band pilot signal, the pilot signal being coupled to the input of the main amplifier, a distortion correction circuit in communication with the main amplifier to correct phase and gain distortion in an output signal at the output of the main amplifier, and a detection circuit which derives control signals from a cross-modulation found in the modulated derivative of the pilot signal, present in the output signal, which control a distortion adjustment of the distortion correction circuit.

In another aspect, the invention relates to a method of correcting distortion in an amplified signal output from an amplifier having an input and an output. The method features inputting a signal to be amplified at the input of the amplifier, injecting a low level, out-of-band pilot signal at the input of the amplifier, detecting a cross-modulated pilot signal component in the output of the amplifier, and, using the detected pilot signal component, generating distortion correction signals to provide distortion correction of the amplified output signal.

BRIEF DESCRIPTION OF THE DRAWING

Other objects, features, and advantages of the invention will be apparent from the following description, taken together with the drawings in which:

FIG. 1 is a schematic block diagram of an embodiment of the amplifier and control circuitry in accordance with the invention.

DESCRIPTION OF THE PREFERRED EMBODIMENT

Referring to FIG. 1, an amplifier configuration 10 has a main amplifier 12 which has a non-linear (in amplitude and/or phase) input/output characteristic. The main amplifier 12 can be, for example, a high power amplifier operating in a Class AB configuration, or it can be such an amplifier having in front of it a predistortion circuitry, such as, for example, the predistortion circuitry illustrated in co-pending U.S. application Ser. No. 09/057,332, filed Apr. 8, 1999, and entitled DYNAMIC PREDISTORTION COMPENSATION FOR A POWER AMPLIFIER. In other embodiments, the amplifier 12 can be an amplifier operating in other configurations, but which have distortion characteristics.

The input to amplifier 12, at input port 14, is received from a predistortion circuitry 40 which receives its input from an inband, bandpass filter 16. A pilot signal is added to the input through an injection coupling 18. The pilot signal is generated at a pilot signal generator 20 and is provided not only to the coupler 18, but to a distortion receiver 22. The input to the bandpass filter 16 over a line 24, is the signal requiring amplification.

The distortion receiver is adapted to synchronously detect the pilot signal in the output of amplifier 12. Accordingly, the output of amplifier 12 is sampled using a coupler 26. The output of coupler 26 passes through a bandpass filter 28 designed to effectively isolate the pilot signal (and thus reduce background noise) and provide, over a line 30, a substantially "pure" pilot signal. The output of the amplifier 12 is bandpass filtered using a bandpass filter 32 to eliminate the pilot signal, which is preferably out-of-band, and the output of the bandpass filter over a line 34 then provides the output signal of the circuit.

In accordance with the claimed invention, the output of the distortion receiver, as described below, represents the cross-modulation appearing on the pilot signal, and represents a distortion contributed by the main amplifier 12. In a preferred embodiment of the invention, the amplifier system includes the distortion correction circuitry 40, positioned in front of amplifier 12 which corrects phase, and/or amplitude of the applied signal to amplifier 12. Alternatively, for example, the amplifier 12 can have internally thereto various correction circuities to adjust its gain and phase versus frequency, over the range of the signal input over line 24, to correct the non-linearities inherent in the amplifier operation. The result, as will be described below, will result in a reduction in the output signal from the distortion receiver reflecting a reduction in distortion output from the amplifier 12.

As background, it is well known that if two signals are applied to a non-linear amplification device, intermodulation products will be produced. The most troublesome of the intermodulation products are those odd order products since they fall close to the signals intended to be amplified. Another phenomenon, however, that is well established, is that if a signal is applied to a distorting amplifier, it will be modulated by the signals causing the distortion. This is caused by the fact that the amplifier is driven into compression, that is, the gain drops slightly between 0.5 dB and several tenths of a dB. Any continuous wave signal (that is, the injected pilot signal over coupler 18), that is amplified at the same time, will have a small amplitude modulated (AM) component on its carrier which can then be detected (that is, detected at the distortion receiver 22). The same can be said of the phase modulation components, that is, the phase modulation compression derived components will also cause a cross modulation signal which can be detected.

Accordingly, the small amplitude pilot signal, coupled to the input signal to be amplified at coupler 18 can be injected at a very low level, out of the band of the signal over line 24. The distortion receiver 22, a sensitive receiver, can then recover the carrier and any subsequent cross-modulation components. Since the spectrum of the cross-modulation components is a function of the distortion products and the spectrum is transferred directly over to any carrier, at any frequency within the amplifier's operating bandwidth, the pilot frequency injected at coupler 18 can be far removed from the actual desired signals. The pilot can then, just as easily, be removed from the amplifier's output using the bandpass filter 32, since it is far out of band, and can further be at a low noise level since cross-modulation is not a function of the level of the pilot signal, but of the level of the distortion producing signals.

As a result, the output of the distortion receiver can be used, for example, in a digital signal processor (DSP) signal processing technology for detecting the cross-modulation and changes caused, for example, by any correction circuitry 40. In addition, there is no requirement for down conversion and search of the input signal to the detection receiver which is prevalent in other systems.

Further, the low level pilot signal, is separated from the main signal by bandpass filter 28 and therefore can reduce the required dynamic range of the distortion receiver 22, compared, for example, to a receiver which finds the pilot signal when it is 60 dB down from the main signal. It is also important to note that the main signal need not be a single tone signal such as that used in CDMA, but can be a signal used in a multitone environment. In such an environment, the cross-modulated components will simply "lay on top of each other" and can be detected as simply distortion products.

Considering the invention in more detail, the resulting cross-modulation products are the result of the non-linear amplitude and phase response of the amplifying (non-linear) device. The actual cross-modulated signal is the non-linear envelope of the main signal and not its distortion components. This is useful in connection with a predistortion circuitry such as that described in U.S. application Ser. No. 09/057,332, because the predistorter will still be tuned for minimum cross-modulation which will optimize the amplifier for its most linear performance.

The invention can further be used in connection with the first loop of a feed-forward amplifier, such as that described in U.S. Pat. No. 5,796,304, issued Aug. 18, 1998, and entitled BROADBAND AMPLIFIER WITH QUADRATURE PILOT SIGNAL, the contents of which are incorporated herein, in their entirety, by reference. In accordance with the invention, therefore, the output of the distortion receiver 22 is directed to control the phase and gain elements of the predistortion circuitry 40. By maintaining a low cross-modulation output from the distortion receiver, the amplifier, consisting of the predistorter and the Class AB amplifier, desirably provide a linear output for the system. Any further non-linear components in the output of the amplifier are then reduced by the second loop of the system.

Additions, subtractions, and other modifications of the disclosed preferred embodiment of the invention will be apparent to those practiced in this field and are within the scope of the following claims.

What is claimed is:

1. An amplifier configuration comprising:
   a main amplifier having an input and an output;
   a pilot signal generator which generates a low level, out-of-band pilot signal, said pilot signal coupled to the input of the main amplifier and an input of a detection circuit;
   a distortion correction circuit in communication with said amplifier to correct phase and gain distortion in an output signal at the output of said main amplifier; and
   said detection circuit which detects only a modulated pilot signal at the output of said main amplifier and derives control signals from a cross-modulation signal in a modulated derivative of the pilot signal present in said output signal which controls a distortion adjustment of said distortion correction circuit.

2. The amplifier of claim 1 wherein said distortion correction circuit is a phase and gain correction circuit.

3. A method of correcting distortion in an amplified signal output from a main amplifier having an input and an output, said method comprising the steps of:
   inputting a signal to be amplified at said input of said main amplifier;
   injecting a low level out-of-band pilot signal at said input of said main amplifier and an input of a detection circuit;
   detecting, using said pilot signal, only a cross-modulated pilot signal component in the output of said main amplifier; and
   using said detected pilot signal to generate distortion correction signals to provide distortion correction of said amplified output signal.

4. The method of claim 3 wherein said correction signals are gain and phase correction signals.

* * * * *